(12) United States Patent
Popescu

(10) Patent No.: US 10,809,327 B2
(45) Date of Patent: Oct. 20, 2020

(54) SHEATH WAVE BARRIER-FREE CONNECTING LEAD AND MAGNETIC RESONANCE TOMOGRAPH WITH CONNECTING LEAD

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 99 days.

(21) Appl. No.: 16/058,725

(22) Filed: Aug. 8, 2018

(65) Prior Publication Data

US 2019/0049533 A1 Feb. 14, 2019

(30) Foreign Application Priority Data

Aug. 9, 2017 (EP) ..................................... 17185434

(51) Int. Cl.
*G01R 33/36* (2006.01)
*G01R 33/30* (2006.01)

(52) U.S. Cl.
CPC ....... *G01R 33/3621* (2013.01); *G01R 33/307* (2013.01); *G01R 33/3642* (2013.01); *G01R 33/3685* (2013.01); *G01R 33/3692* (2013.01)

(58) Field of Classification Search
CPC .............. G01R 33/3621; G01R 33/307; G01R 33/3642; G01R 33/3685; G01R 33/3692
USPC .......................................................... 324/322
See application file for complete search history.

(56) References Cited

U.S. PATENT DOCUMENTS

| 7,608,778 | B2 | 10/2009 | Reykowski | |
|---|---|---|---|---|
| 7,673,081 | B2 | 3/2010 | Grottel et al. | |
| 8,085,048 | B2 * | 12/2011 | Biber | G01R 33/3692 |
| | | | | 324/307 |
| 8,487,622 | B2 * | 7/2013 | Biber | G01R 33/3692 |
| | | | | 324/318 |
| 8,766,632 | B2 * | 7/2014 | Biber | G01R 33/422 |
| | | | | 324/307 |

(Continued)

FOREIGN PATENT DOCUMENTS

| DE | 102006052217 A1 | 5/2008 |
|---|---|---|
| DE | 102013210381 B3 | 5/2014 |

(Continued)

OTHER PUBLICATIONS

European Search Report for corresponding Application No. 17185434. 2-1022, dated Mar. 14, 2018.

*Primary Examiner* — Patrick Assouad
*Assistant Examiner* — Demetrius R Pretlow
(74) *Attorney, Agent, or Firm* — Lempia Summerfield Katz LLC

(57) ABSTRACT

A connecting lead for a receiving antenna of a magnetic resonance tomograph, to a system made up of a magnetic resonance tomograph and to a receiving antenna is provided. The connecting lead includes a resonant contactless power coupler. The receiving antenna is magnetically resonantly coupled by the connecting lead to the magnetic resonance tomograph. The magnetic resonance tomograph includes an alternating current generator that may be connected to the connecting lead and is configured to supply the active amplifier element of the receiving antenna with energy.

14 Claims, 3 Drawing Sheets

(56) References Cited

U.S. PATENT DOCUMENTS

| | | | |
|---|---|---|---|
| 8,994,374 B2* | 3/2015 | Albsmeier | G01R 33/3692 324/318 |
| 8,994,375 B2* | 3/2015 | Albsmeier | G01R 33/3692 324/318 |
| 9,220,473 B2* | 12/2015 | Blumhagen | G01R 33/481 |
| 9,244,141 B2* | 1/2016 | Greim | G01R 33/422 |
| 9,341,689 B2 | 5/2016 | Leussler | |
| 9,689,940 B2* | 6/2017 | Biber | G01R 33/3692 |
| 9,804,238 B2* | 10/2017 | Albsmeier | G01R 33/3621 |
| 2002/0070730 A1* | 6/2002 | Heid | G01R 33/4215 324/318 |
| 2008/0106264 A1 | 5/2008 | Fischer et al. | |
| 2011/0012598 A1* | 1/2011 | van Helvoort | G01R 33/34 324/318 |
| 2011/0257511 A1 | 10/2011 | Krueger | |
| 2012/0249140 A1* | 10/2012 | Albsmeier | G01R 33/3692 324/309 |
| 2012/0277529 A1* | 11/2012 | Popescu | A61B 1/00029 600/109 |
| 2012/0313645 A1* | 12/2012 | Biber | G01R 33/3692 324/322 |
| 2013/0181716 A1* | 7/2013 | Greim | G01R 33/422 324/322 |
| 2013/0184566 A1* | 7/2013 | Kreischer | G01R 33/34084 600/422 |
| 2013/0200894 A1* | 8/2013 | Albsmeier | A61B 5/055 324/318 |
| 2014/0097844 A1* | 4/2014 | Tomiha | G01R 33/30 324/321 |
| 2014/0218035 A1* | 8/2014 | Okamoto | G01R 33/3692 324/322 |
| 2014/0218134 A1 | 8/2014 | Martius et al. | |
| 2014/0292339 A1* | 10/2014 | Albsmeier | G01R 33/3621 324/322 |
| 2014/0361769 A1 | 12/2014 | Hardie et al. | |
| 2017/0018935 A1 | 1/2017 | Georgakopoulos et al. | |
| 2017/0160356 A1* | 6/2017 | Liu | G01R 33/3657 |
| 2017/0219667 A1 | 8/2017 | Fackelmeier et al. | |
| 2017/0307702 A1* | 10/2017 | Kanakasabai | G01R 33/3852 |
| 2018/0081005 A1* | 3/2018 | Yang | G01R 33/3664 |
| 2019/0331745 A1* | 10/2019 | Chen | G01R 33/34076 |

FOREIGN PATENT DOCUMENTS

| | | |
|---|---|---|
| DE | 102013201685 A1 | 8/2014 |
| DE | 102013205464 A1 | 10/2014 |
| DE | 102016201441 A1 | 8/2017 |

* cited by examiner

SHEATH WAVE BARRIER-FREE CONNECTING LEAD AND MAGNETIC RESONANCE TOMOGRAPH WITH CONNECTING LEAD

This application claims the benefit of EP17185434.2, filed on Aug. 9, 2017, which is hereby incorporated by reference in its entirety.

BACKGROUND

The present embodiments relates to a connecting lead for a receiving antenna of a magnetic resonance tomograph. The receiving antenna includes active amplifier elements.

Magnetic resonance tomographs are image-generating apparatuses that, for the purposes of imaging an object under examination, orient nuclear spins of the object under examination with a strong external magnetic field and excite the nuclear spins to precess around the orientation by an alternating magnetic field. The precession or return of the spins from the excited state into a lower-energy state generates in response an alternating magnetic field that is received via antennas.

Spatial encoding is impressed onto the signals with the assistance of magnetic gradient fields. The encoding subsequently permits assignment of the received signal to a volume element. The received signal is then evaluated, and a three-dimensional image representing the object under examination is provided. The signal may be received by local receiving antennae known as "local coils" that are arranged in the immediate vicinity of the object under examination in order to achieve a better signal-to-noise ratio. The receiving antennae may, however, also be installed in a patient couch.

The receiving antennae are conventionally connected via a connecting lead to a receiver of the magnetic resonance tomograph that evaluates received magnetic resonance signals. The receiving antennae also have low-noise preamplifiers (e.g., low-noise amplifiers, LNA) that amplify the weak magnetic resonance signals prior to transmission via the connecting lead. The current required for operation of the preamplifier is likewise transmitted via the same or separate cores of the connecting lead. The connecting lead may also be part of a patient couch, for example, supplying spine coils in the patient couch or serving as a distributor for plug-in contacts arranged on the patient couch for external local coils.

The nuclear spins are excited by high frequency pulses with powers of up to several kilowatts that are emitted into an examination region of the magnetic resonance tomograph. At conventional magnetic field strengths of between 0.5 T and 3 T and in some cases also up to 7 T, excitation signals have typical wavelengths of between 2 m and 15 m, which provides that the cable lengths of the connecting lead are sometimes already longer than one quarter of the wavelength and themselves act as an antenna. Resonant voltage and current peaks that may endanger the patient and also the equipment may then be formed on the conductors and/or shielding.

Such induced currents and voltages, which are also known as sheath waves, may be suppressed using various known sheath wave filters that are intended to suppress the formation of the sheath waves. Document DE 10 2016 201 441, for example, discloses a sheath wave barrier that is arranged on a carrier material. Document DE 10 2013 201 685 describes a dielectric sheath wave barrier.

Document DE 10 2013 210 381 A1 discloses a connecting lead made from a metamaterial.

Known sheath wave barriers, however, have the disadvantage that the sheath wave barriers are optimized for a specific frequency of the excitation signal. The sheath wave barriers are furthermore heavy and inflexible.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a connecting lead for a receiving antenna of a magnetic resonance tomograph that facilitates handling of the magnetic resonance tomograph is provided.

The connecting lead according to one or more of the present embodiments for a receiving antenna of a magnetic resonance tomograph with an active amplifier element includes a resonant, contactless power coupler. For the purposes of the present embodiments, a resonant power coupler may be an apparatus configured to couple an alternating current across a galvanic isolation at a resonant frequency of the apparatus. Resonant at the resonant frequency is taken to apply if, in the event of a 1%, 2%, 5% or 10% deviation in the frequency of the alternating current from the resonant frequency, power transmission of the power coupler drops, for example, by 6 dB, 12 dB, 18 dB or more.

The connecting lead according to one or more of the present embodiments may have a common conductor pair with a common resonant power coupler for the MRT signal and an energy supply of the active amplifier element. In one embodiment, the connecting lead may have a plurality of conductor pairs (e.g., twisted core pairs and/or coaxial cables) each having a resonant contactless power coupler.

The resonant contactless power coupler in the connecting lead according to one or more of the present embodiments permits the propagation of signals only in the region of a resonant frequency and blocks the formation of sheath waves at other frequencies such that the connecting lead may be used without hazard for a plurality of Larmor frequencies.

The receiving antenna according to one or more of the present embodiments has an active amplifier element and an energy supply. The energy supply is configured to supply the active amplifier element with energy from a radio-frequency signal transmitted via the connecting lead that has the resonant frequency of the resonant contactless power coupler. The receiving antenna may be a local coil, but a coil fixedly connected to the magnetic resonance tomograph or the patient couch, such as, for example, a body coil or a spine coil, may also be provided. The receiving antenna according to one or more of the present embodiments shares the advantages of the connecting lead.

The system according to one or more of the present embodiments includes the connecting lead, a magnetic resonance tomograph, and the receiving antenna. The receiving antenna is magnetically resonantly coupled by the connecting lead to the magnetic resonance tomograph. Magnetically resonantly denotes, for example, a coupling in which energy stored in the magnetic field is fed back in and not emitted in the form of an electromagnetic wave. This does not rule out coupling or transmission of signals or energy from occurring by electrical conduction in a conductor at least in places in the connecting lead according to one or more of the present embodiments. In one embodiment, portions of the connection between the receiving antenna and the magnetic resonance tomograph may also be provided by other leads that are not according to the present embodiments (e.g., in shielded regions unirradiated by excitation pulses).

The magnetic resonance tomograph of the system according to one or more of the present embodiments includes an alternating current generator. The alternating current generator may be connected to the connecting lead and is configured to supply the active amplifier element of the receiving antenna with energy. The alternating current generator thus has a sufficient power output to operate the active amplifier element with the supplied energy. The alternating current generator is configured, for example, to generate an alternating current having a frequency that is substantially identical to a resonant frequency of the resonant contactless power coupler. Substantially identical to the resonant frequency may be that the alternating current generated by the alternating current generator passes through the resonant contactless power coupler with attenuation of less than 1.5 dB, 3 dB, 6 dB or 12 dB in comparison with an alternating current of precisely the resonant frequency.

The system according to one or more of the present embodiments permits operation of the receiving coil at any desired Larmor frequencies, providing the Larmor frequency differs sufficiently from the resonant frequency of the resonant contactless power coupler.

In one embodiment of the connecting lead, a resonant frequency of the resonant contactless power coupler differs from a Larmor frequency of the magnetic resonance tomograph. For the purposes of the present embodiments, the resonant frequency of the power coupler is a frequency at which power transmission for an alternating current via the power coupler is at a maximum or attenuation is at a minimum as a function of frequency. Attenuation may increase for frequencies above and below the resonant frequency, the maximum, for example, being a global maximum. For the purposes of the present embodiments, the Larmor frequency differs if the attenuation of an alternating current at the Larmor frequency in comparison with an alternating current at the resonant frequency is greater than 12 dB, 18 dB, or 24 dB on passage through the resonant contactless power coupler.

Power transmission at a resonant frequency that differs from the Larmor frequency advantageously provides not only efficient energy transmission via the resonant contactless power coupler but also reliable suppression of sheath waves at the Larmor frequency.

In one embodiment of the connecting lead, the connecting lead includes two or more resonant power couplers. A second resonant contactless power coupler may be arranged at a distance along the connecting lead from the first resonant contactless power coupler that is less than one quarter of the wavelength of a radio wave having the highest Larmor frequency to be evaluated by the magnetic resonance tomograph. The distance is, for example, less than 2 m, 1 m, 0.5 m or 0.25 m. Both power couplers are in each case associated with the same conductor pair or core pair of the connecting lead, such that no continuous lead segment that is ohmically conductive or conductive for an alternating voltage having a frequency that differs from the resonant frequency, is larger than the stated distance, and, as an antenna for an excitation pulse, builds up a high voltage is formed. In the case of a plurality of parallel conductor pairs, a dedicated resonant contactless power coupler is provided for each pair.

Two or more resonant contactless power couplers segment the conductor(s) of the connecting lead at a distance that is less than one quarter of the wavelength of the conductor(s) of the connecting lead, such that, on exposure to the excitation pulses, the individual segments merely build up nonhazardous voltages or currents.

In one embodiment of the connecting lead, the resonant contactless power coupler has a first connector and a second connector, each having two poles, and an insulator. The first connector and second connector are, for example, galvanically isolated from one another by the insulator. In other words, a first conductor pair and a second conductor pair, the first conductor pair being electrically connected to the first connector and the second conductor pair being electrically connected to the second connector, are galvanically isolated (e.g., for direct current) from one another.

The galvanic isolation prevents the formation of sheath waves for low frequencies.

In one possible embodiment of the connecting lead, the poles of the first connector are connected to one another by a first conductor loop and the poles of the second connector are connected to one another by a second conductor loop. The first conductor loop and the second conductor loop may, for example, include an individual turn or a plurality of turns. The conductor loop may, for example, enclose an area (e.g., in the shape of a circle, an ellipse, or a polygon) that is as large as possible. As large as possible may be that the area is no less than 70%, 50% 25% or 10% of the area of a circle having the same circumference. The first conductor loop is isolated from the second conductor loop by the insulator. For example, the first conductor loop and the second conductor loop may be positioned on opposing surfaces of a printed circuit board as a conductor track. In one embodiment, the printed circuit board takes the form of a flexible printed circuit board. A projection of a first area enclosed by the first conductor loop onto a second area enclosed by the second conductor loop is, for example, substantially encompassed by the second area. Substantially may be that the projection occupies more than 90%, 70%, 50% or 20% of the area enclosed by the second conductor loop. In other words, the first area and the second area are located opposite one another such that a magnetic field induced by an alternating current in the first conductor loop passes through the second area surrounded by the second conductor loop such that, at the resonant frequency, an alternating current and an alternating voltage that adopt at least 90%, 70%, 50% or 20% of the power of the alternating voltage applied to the first conductor loop and the flowing alternating current are induced in the second conductor loop.

Two coupled conductor loops coupled by alternating magnetic fields provide a simple way of resonantly transmitting signals and energy with simultaneous galvanic decoupling.

In one embodiment of the connecting lead, the first conductor loop is electrically and/or magnetically coupled to a resonance-generating element. Electrically and/or magnetically coupled may be that the resonance-generating element brings about a change in the amplitude of the alternating current and/or alternating voltage at the resonant frequency of 6 dB, 12 dB, 18 dB or more in comparison with a value without the resonance-generating element. A capacitor may, for example, be arranged parallel to the conductor loop and may form with the latter an antiresonant circuit at the resonant frequency. In an embodiment, a resonance-generating element is in each case coupled to the first conductor loop and the second conductor loop.

A resonance-generating element increases the efficiency of inductive transmission by the conductor loop at the resonant frequency, and, by attenuated transmission at other frequencies, the resonance-generating element simultaneously prevents the formation of sheath waves with a hazardous amplitude at these frequencies.

In one embodiment, the resonance-generating element of the connecting lead includes a first inductor and a first capacitor. In one embodiment, a third conductor loop and a capacitor that are arranged such that the third conductor loop and the capacitor inductively interact with the first conductor loop and/or second conductor loop may be provided. These may, for example, be arranged on the printed circuit board concentrically to the first conductor loop and/or the second conductor loop.

A resonance-generating element taking the form of an inductor and a capacitor may be coupled into an inductive connection and so modify frequency behavior. The additional inductor independent of the inductive connection renders the frequency behavior substantially independent of the first conductor loop and the second conductor loop.

In one embodiment of the connecting lead, the connecting lead includes a mechanical plug-in element having a first conductor loop. The mechanical plug-in element is configured to provide, with a corresponding coupling element having a second conductor loop, a mechanical connection to a resonant contactless power coupler. For the purposes of the present embodiments, a plug-in element and coupling element may be any mechanical plug and socket system that is suitable for creating a detachable connection between the plug-in element and the coupling element, specifies a predetermined relative position of plug-in element and coupling element, and magnetically couples the first conductor loop and the second conductor loop. In the predetermined relative position, the first conductor loop and the second conductor loop are, for example, galvanically isolated from one another by an insulator or air gap. A resonance-generating element is provided in the plug-in element and/or the coupling element such that, in the predetermined relative position, the plug-in element and the coupling element provide a resonant contactless power coupler.

The connecting lead according to one or more of the present embodiments with the plug-in element provides a reliable and contamination-insensitive plug-in connector for a receiving antenna.

In one embodiment of the connecting lead, the connecting lead includes a twisted conductor pair or core pair. Twisted core pairs of CAT cables from network engineering may, for example, be provided.

Due to symmetry, twisted conductor pairs or core pairs may be insensitive to external induction since the induced currents cancel one another out.

In one embodiment of the receiving antenna, the receiving antenna includes a signal converter. The signal converter is configured to convert a received magnetic resonance signal into a frequency range that is located in a resonant range of the resonant contactless power coupler. For example, a received and amplified magnetic resonance signal may be converted by a mixer with an oscillator frequency to the resonant frequency as an intermediate frequency. In one embodiment, the magnetic resonance signal may be digitized in the receiving antenna and modulated onto a carrier wave having the resonant frequency.

In one embodiment, a common connecting lead for energy supply and transmission of the received magnetic resonance signals may be provided. In one embodiment, a plurality of connecting leads for transmitting different signals may be provided.

The signal converter allows the magnetic resonance frequency signal to be converted for transmission via the connecting lead according to one or more of the present embodiments to the resonant frequency of the resonant contactless power coupler.

In one embodiment of the receiving antenna, the receiving antenna includes a demodulator configured to decode a modulated item of information in the radio-frequency signal.

Commands may be transmitted to a controller in the receiving antenna (e.g., the controller may be configured to tune the receiving antenna during excitation pulses of the magnetic resonance tomograph).

In one embodiment of the system, the alternating current generator of the magnetic resonance tomograph includes a modulator. The modulator is, for example, configured to modulate an item of information onto the alternating current.

The modulator makes it possible to send signals and settings to the receiving antenna without additional connection leads.

In one embodiment of the system having a receiving antenna with a signal converter, the magnetic resonance tomograph includes a receiver that is configured to receive and evaluate a magnetic resonance signal converted by the signal converter of the receiving antenna into a resonant range of the resonant contactless power coupler.

In one embodiment, the connecting lead may, via a common core pair, transmit energy and optionally control commands to the receiving antenna and, in the opposite direction, received magnetic resonance signals that may then be received, evaluated, and reproduced as images by the magnetic resonance tomograph.

In one embodiment of the system, the system includes a patient couch. The first connecting lead is arranged in the patient couch.

The connecting lead according to one or more of the present embodiments may take the form of a flat flexible printed circuit board and therefore requires only little structural height in the patient couch. The patient couch may therefore itself be of particularly thin construction, which is a major advantage, for example, given the confined space available for passage of the patient.

In one embodiment of the system, the patient couch includes a second connecting lead for the connector to a local coil. The connecting lead or at least the resonant contactless power coupler is, for example, constructed with a flexible printed circuit board, such that the flexible printed circuit board is flexible to a limited extent. The patient couch includes, for example, a retraction device configured to arrange the second connecting lead extendably in the patient couch. For example, the retraction device may include a winding core to which the second connecting lead is fastened and which may be automatically wound in under spring tension on release of a latch or brake. However, a tensioning device that, when a locking element is undone, draws in the second connecting lead under spring action in one or more parallel tracks, which may also counter-rotate via return rollers, may, for example, also be provided.

The flexible and flat connecting lead according to one or more of the present embodiments makes it possible to roll up the connecting lead compactly or deflect the connecting lead around small radii such that a connecting lead for a local coil may also be provided permanently on the patient couch, which substantially simplifies handling.

DETAILED DESCRIPTION

Figure 1:
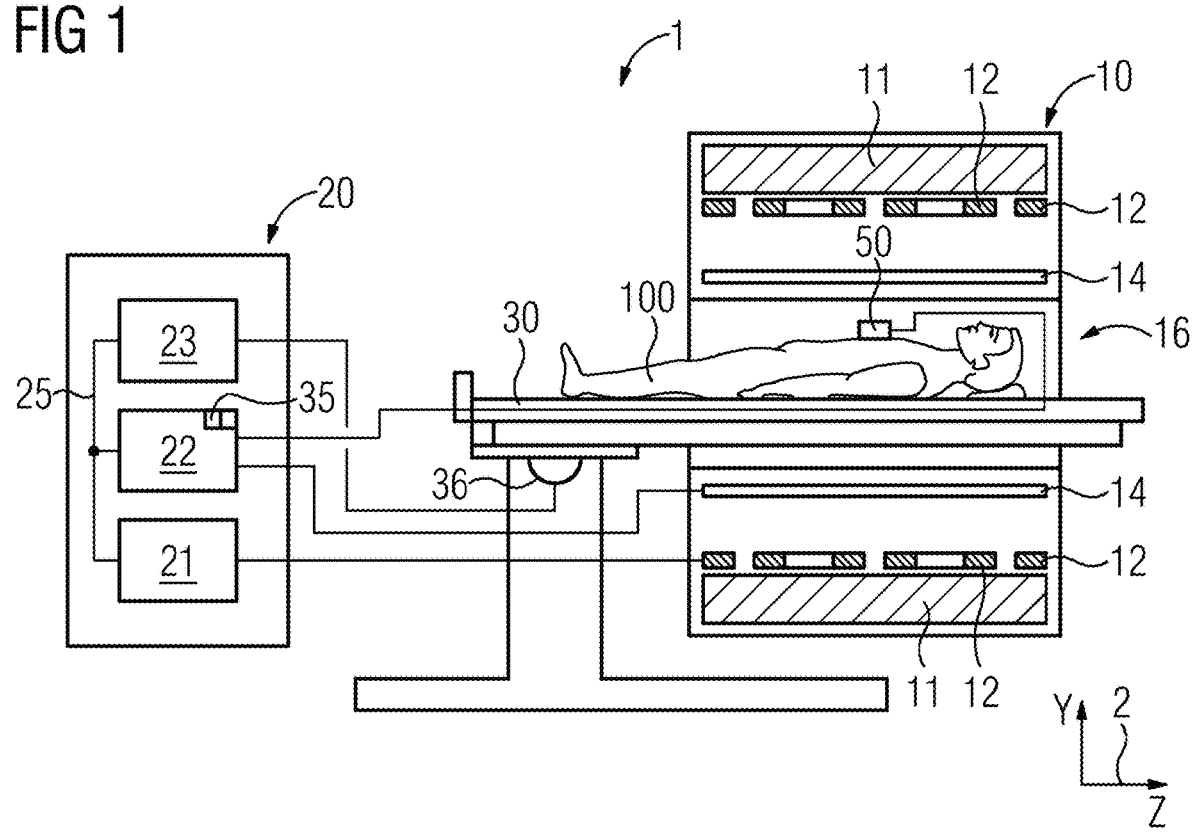
FIG. 1 shows a schematic diagram of one embodiment of a system made up of a magnetic resonance tomograph, a receiving antenna, and a connecting lead.

FIG. 1 shows a schematic diagram of one embodiment of a system made up of a magnetic resonance tomograph, a receiving antenna, and a connecting lead.

The magnet unit 10 includes a field magnet 11 that generates a static magnetic field B0 for orienting nuclear spins of samples or of the patient 100 in a capture region. The capture region is arranged in a patient tunnel 16 that extends in a longitudinal direction 2 through the magnet unit 10. A patient couch 30 may be moved in the patient tunnel 16 by the positioning unit 36. The field magnet 11 is conventionally a superconductive magnet that may provide magnetic fields with a magnetic flux density of up to 3 T or even higher in the case of the latest equipment. Permanent magnets or electromagnets with normally conductive coils may, however, also be used for lower field strengths.

The magnet unit 10 further includes gradient coils 12 that are configured to overlay variable magnetic fields in three spatial directions on the magnetic field B0 for spatial differentiation of the acquired imaging regions in the examination volume. The gradient coils 12 are conventionally coils of normally conductive wires that are capable of generating fields orthogonal to one another in the examination volume.

The magnet unit 10 likewise includes a body coil 14 configured to emit a radio-frequency signal supplied via a signal lead into the examination volume and to receive resonance signals emitted by the patient 100 and deliver the resonance signals via a signal lead.

A control unit 20 supplies the magnet unit 10 with the various signals for the gradient coils 12 and the body coil 14 and evaluates the received signals.

The control unit 20 accordingly includes a gradient driver 21 configured to supply the gradient coils 12 via supply leads with variable currents that provide the desired gradient fields in the examination volume in a time-coordinated manner.

The control unit 20 also includes a radio-frequency unit 22 configured to generate a radio-frequency pulse with a specified time profile, amplitude, and spectral power distribution in order to excite magnetic resonance of the nuclear spins in the patient 100. Pulse powers in the kilowatt range may be reached here. The excitation pulses may be emitted via the body coil 14 or also via a local transmitting antenna into the patient 100.

A controller 23 communicates via a signal bus 25 with the gradient controller 21 and the radio-frequency unit 22.

A local coil 50, which is connected via a connecting lead 33 according to one or more of the present embodiments to the radio-frequency unit 22, is arranged on the patient 100. The radio-frequency unit 22 may include an alternating current generator 35 that provides a radio-frequency alternating voltage or alternating current to supply energy to the local coil 50 that is transmitted via the connecting lead 33. In the reverse direction, the local coil 50 is configured to convert received magnetic resonance signals into a frequency range that may be transmitted via the connecting lead 33 according to one or more of the present embodiments. Details relating to the individual components are described below in relation to the other figures.

Figure 2:
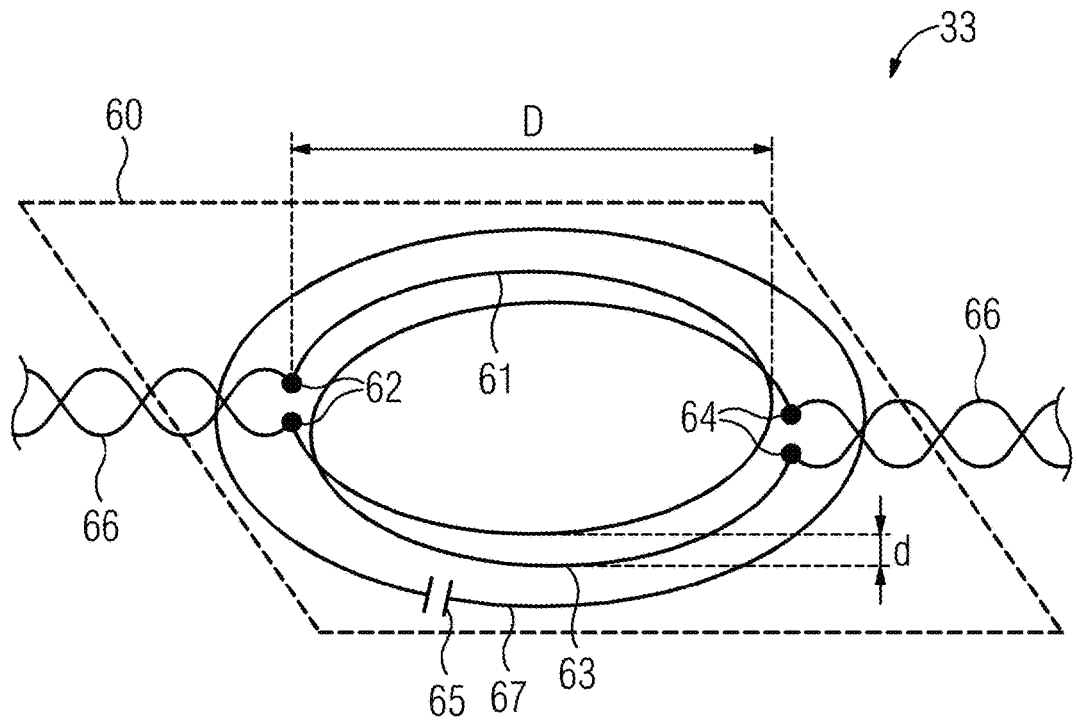
FIG. 2 shows a schematic diagram of a portion of a connecting lead according to an embodiment.

FIG. 2 shows a portion of a connecting lead 33 according to an embodiment with a resonant contactless power coupler 60. The resonant contactless power coupler 60 includes a first conductor loop 61 that electrically connects the two first poles 62 to one another and in so doing encloses an area. The diameter D of the loop may be less than 30 mm. The diameter depends, for example, on the resonant frequency at which energy transmission is intended to proceed and a desired efficiency of the resonant contactless power coupler 60. Efficiency may be increased with a larger diameter, with a smaller diameter being sufficient at a higher frequency. In one embodiment, the first conductor loop may have a plurality of turns.

A first portion of electrical conductors 66 or cores of the connecting lead 33 is connected to the first poles 62, such that the conductor loop 61 connects the first poles 62 together electrically. The first poles 62 and the first conductor loop 61 may, for example, take the form of a conductor track on a substrate of a printed circuit board that is, however, not shown in FIG. 2 for clarity. The substrate used may be a material that has low dielectric losses at the intended resonant frequency (e.g., an "FR4" material for frequencies in the MHz range).

The second conductor loop 63 is arranged, separated by a distance d, parallel to the first conductor loop 61. The distance and the parallel arrangement may, for example, be achieved by arranging the first conductor loop 61 and the second conductor loop 62 on opposing, planar sides of a printed circuit board substrate, such that the distance d is obtained by the thickness of the substrate. In this embodiment, the printed circuit board substrate serves as insulator.

In one embodiment, the printed circuit board may not be planar, but instead, for example, may have a flexible substrate that may be bent. Even a locally varying distance of the first conductor loop 61 from the second conductor loop 63 is possible, providing the distance is constant over time such that the electrical and/or magnetic coupling of the two conductor loops may be maintained with sufficient strength, and the resonant frequency of the resonant contactless coupler does not substantially change (e.g., by less than 1%, 5% or 10%). The distance may be less than 7 mm (e.g., less than 5 mm, 2 mm, or 1 mm).

Resonance at a predetermined frequency favorable to energy transmission is achieved by one or more resonance-generating elements. In one embodiment of the resonant contactless power coupler 60, the resonance-generating element includes one or more third conductor loops 67 (e.g., in each case, a third conductor loop 67 that is arranged around the first conductor loop 61 or the second conductor loop 63, on a surface of the printed circuit board). For clarity, FIG. 2 only shows the third conductor loop 67 around the first conductor loop 61.

The third conductor loop 67 is an inductor that also has a self-capacitance and thus brings about resonance at a natural frequency. Since this frequency is conventionally distinctly higher than technically practical frequencies for energy transmission in the MHz and GHz range, the resonant frequency may be adjusted to a value suitable for the predetermined resonant frequency by an additional capacitor, depending on the frequency range by a capacitor 65 or by a capacitor formed, for example, on the printed circuit board. In order to reduce the resonant frequency, inductance may be increased by a plurality of turns of the conductor loop to form a coil.

The first conductor loop 61 and the second conductor loop 63 may in each case have a dedicated third conductor loop 67 so that both the first conductor loop 61 and the second conductor loop 63 may be tuned independently of one another. In one embodiment, the first conductor loop 61 and the second conductor loop 63 are rendered resonant by joint coupling to a single third conductor loop 67.

In one embodiment, the first conductor loop 61 and the second conductor loop 63 themselves are made resonant at the desired resonant frequency (e.g., by a capacitor that connects the first poles 62 and second poles 63 and makes the first conductor loop 61 and second conductor loop 63 into parallel resonant circuits). The resonant frequency is determined, for example, by the geometry of the conductor loops and the capacitance values.

The electrical conductors 66 of the connecting lead 33, which are connected to the first poles 62 and the second poles 64, may, as shown, take the form of a twisted two-wire lead (e.g., twisted pair), but an embodiment as a shielded coaxial cable may, for example, also be provided. Twisted-pair cables are inexpensively available as LAN cables and, due to the twisting, are largely insusceptible to induced currents.

Figure 3:
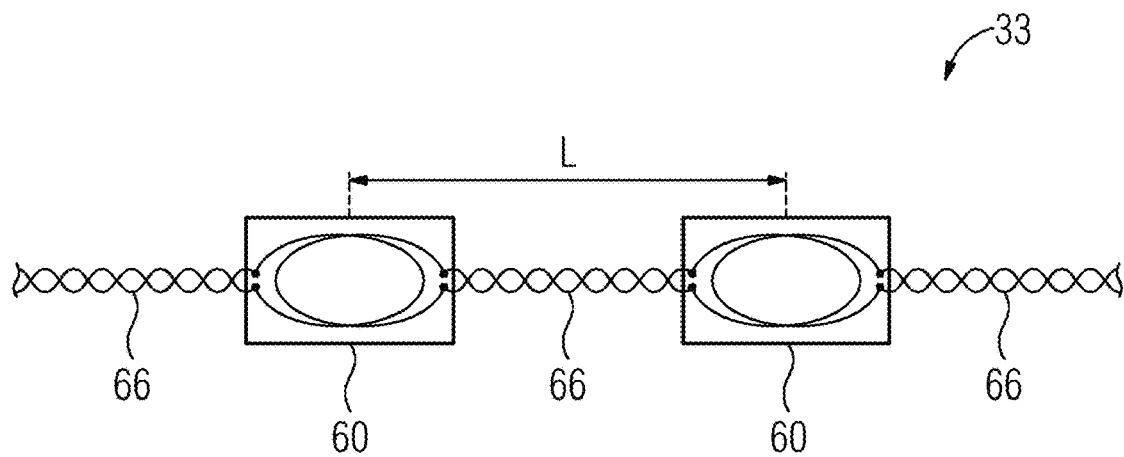
FIG. 3 shows a schematic diagram of a connecting lead according to an embodiment with a plurality of resonant contactless power couplers.

FIG. 3 shows a portion of a connecting lead 33 according to one or more of the present embodiments having a plurality of resonant contactless power couplers 60. The resonant contactless power couplers 60 are, for example, at a distance L that is less than one quarter of the wavelength of the Larmor frequency of the magnetic resonance tomograph 1 on the electrical conductors 66. If a magnetic resonance tomograph 1 is configured for different nuclei, the wavelength is the highest occurring Larmor frequency.

Figure 4:
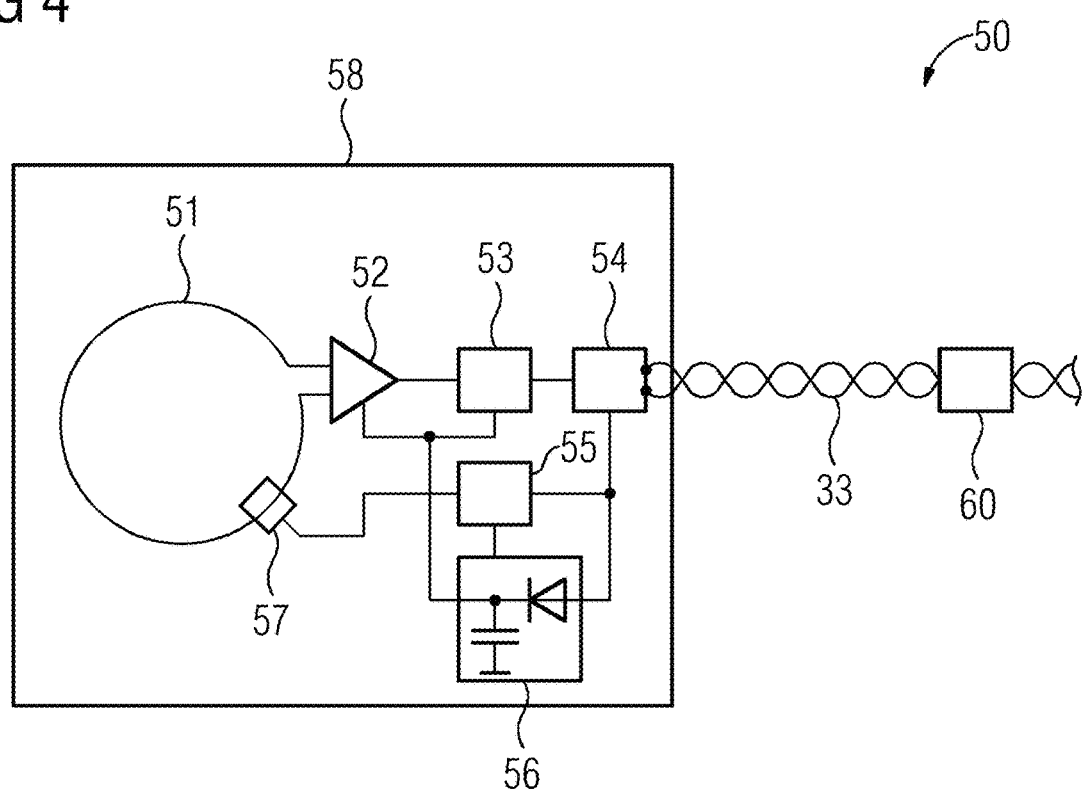
FIG. 4 shows a schematic diagram of a receiving antenna according to an embodiment.

FIG. 4 shows one possible embodiment of a receiving antenna (e.g., a local coil 50). The local coil 50 includes an antenna coil 51 with which magnetic resonance signals are received and then amplified by the low-noise preamplifier 52 as active amplifier element. In a further act, the magnetic resonance signals are converted by a signal converter 53 into a frequency range that may be transmitted by the resonant contactless power coupler 60. The signal converter 53 may, for example, be an analog or digital frequency mixer. In one embodiment, the magnetic resonance signal may be digitized in the signal converter by an AD converter and modulated onto a carrier frequency in the transmission range of the resonant contactless power coupler 60.

A diplexer 54 separates the incoming and outgoing signals passing via the connecting lead 33. The diplexer 54 may, for example, separate based on frequencies if the transmission range of the resonant contactless power coupler 60 is wide enough to transmit two different carrier frequencies that may subsequently be sufficiently separated again, with a reasonable level of effort, by filters. In one embodiment, for energy transmission, a frequency precisely corresponds to the resonant frequency of the resonant contactless power coupler 60 in order to provide the highest possible efficiency of energy transmission. Information transmission, in contrast, may proceed at margins of the resonant range, since greater attenuation may, for example, be offset by amplification (e.g., in the case of secured digital transmission).

The diplexer 54 may, however, also separate the signals, for example, by the direction of propagation of the wave on the connecting lead. Gyrators or directional couplers may, for example, be provided for this purpose.

A demodulator 55 that demodulates information received via the connecting lead and forwards the information to the subunits may be provided in the receiving antenna according to one or more of the present embodiments or local coil 50 in order to receive control commands. The demodulator 55 may also include a controller for interpreting the information. In the simplest case, the information may be modulated by amplitude modulation, frequency modulation, or another analog or digital modulation onto the frequency with which the energy is transmitted to the receiving coil. For example, a pilot signal with which a detuning unit 57 may be activated, and the antenna coil 51 may be detuned or the antenna coil 51 may be interrupted, may be transmitted.

In one embodiment, the information may be a reference clock that is used, in the case of an analog signal converter, to transmit a phase-accurate mixed signal or, in the case of a digital signal converter, a radio-accuracy reference clock for digitization. In this manner, the phase of the MR signal may be precisely measured across the system.

The energy supply 56 rectifies the signal for energy transmission and smoothes or buffers the signal by a capacitor. The energy received in this manner is further distributed to the other units such as low-noise preamplifier, signal converter, and demodulator.

The individual elements of the receiving coil or local coil 50 are arranged in a housing 58 that may be shielded.

Figure 5:
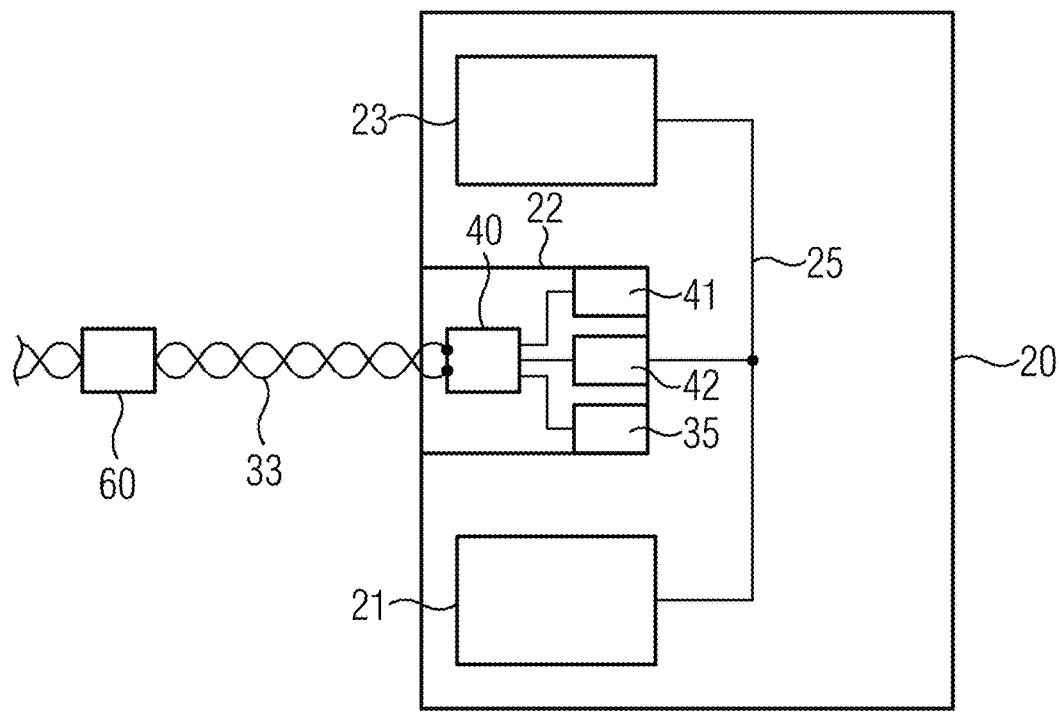
FIG. 5 shows a schematic diagram of a control unit of a magnetic resonance tomograph according to an embodiment.

FIG. 5 shows one possible embodiment of a control unit 20 of a magnetic resonance tomograph 1 of a system. The magnetic resonance tomograph 1 in FIG. 5 includes the units corresponding to the local coil 50 in FIG. 4.

The radio-frequency unit 22 includes a diplexer 40 configured to combine the various signals to be transmitted via the resonant contactless power coupler 60 or the connecting lead 33 or to separate incoming signals. The statements already made with regard to the diplexer 54 of the local coil 50 apply here too; combination may proceed, for example, based on different frequencies and/or a different direction of propagation of the signals.

A receiver 41 receives incoming magnetic resonance signals from the diplexer 40 and evaluates the signals for subsequent image processing, for example, by digitizing the signals in order to permit evaluation of amplitude, frequency, and phase. An alternating current generator 35 generates a radio-frequency signal having a frequency identical or close to the resonant frequency of the resonant contactless power coupler 60 and supplies the signal to the diplexer 40 that transmits the signal via the connecting lead 33 to the local coil 50. In one embodiment, a modulator 42 may impress information onto the signal of the alternating current generator 35. It is accordingly possible by amplitude modulation, frequency modulation, or another analog or digital modulation method to transmit a reference clock to the local coil or also setting commands, for example, in order to activate detuning 57 of the antenna coil 51 by a pilot signal or a digital command sequence.

Figure 6:
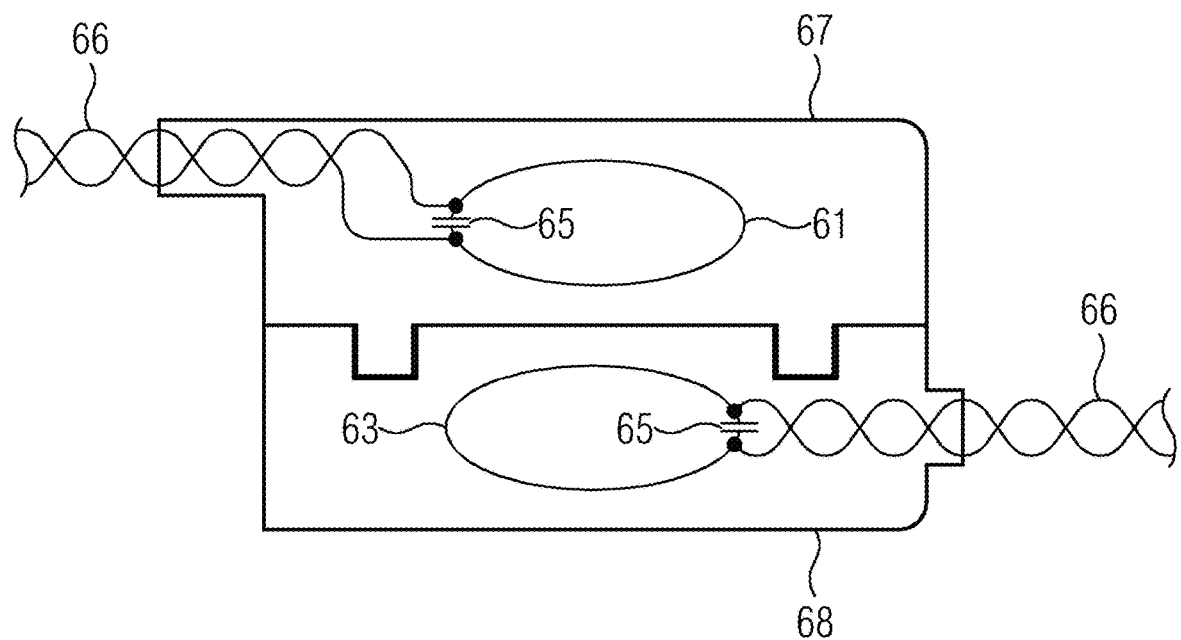
FIG. 6 shows a schematic diagram of a portion of a plug and socket system of a connecting lead according to an embodiment.

FIG. 6 shows a schematic diagram of a plug and socket system of a connecting lead 33 according to one or more of the present embodiments. The resonant contactless power coupler 60 is made up of, for example, the same elements as have already been explained in relation to FIG. 2. The first conductor loop 61 is, however, located in a mechanical plug-in element 69.

The mechanical plug-in element 69 is configured to be brought into detachable mechanical connection with a corresponding coupling element 68. Interacting retaining devices such as hooks, latches, guide elements, and recesses may, for example, be provided on the mechanical plug-in element 69 and the coupling element 68 in order to provide a predetermined relative position of the plug-in element 69 and coupling element 68. In this secured relative position, the first conductor loop 61 and the second conductor loop 63 are arranged such that the first conductor loop 61 and the second conductor loop 63 are isolated from one another by an air gap or, for example, the material of the plug-in element 69 and/or of the coupling element 68 as insulator. The areas enclosed by the first conductor loop 61 and the second conductor loop 63, however, are simultaneously located opposite one another such that a strong magnetic interaction prevails. The first conductor loop 61 and the second conductor loop 63 may be arranged such that the enclosed areas extend congruently opposite one another, parallel to one another, and at the smallest possible distance from one another.

In one embodiment, a plurality of first conductor loops 61 in each case in one plug-in element 69 and a plurality of second conductor loops 63 in a coupling element 68 may be arranged adjacent one another such that the conductor loops are in each case magnetically coupled in pairs to provide mutually independent transmission channels in the connecting lead 33. A sufficient distance in the direction parallel to a plane of the conductor loops 61, 63 is to be provided such that crosstalk between the individual conductor loops 61, 63 of the different transmission channels is sufficiently low. It is sufficient to this end to keep the distance in an order of magnitude of the dimensions of the conductor loops 61, 63 and, for example, large with respect to the distance of the first conductor loop 61 and the second conductor loop 63 of a corresponding pair.

The coupling element 68 may also be, for example, arranged in a housing of a patient couch or be part of the housing. The connecting lead 33 is, for example, a reliable connector capable of withstanding contamination.

Although the invention has been illustrated and described in greater detail with reference to the exemplary embodiments, the invention is not restricted by the disclosed examples. Other variations may be derived therefrom by a person skilled in the art without going beyond the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A connecting lead for a receiving antenna of a magnetic resonance tomograph, wherein the receiving antenna includes active amplifier elements, the connecting lead comprising:
 a resonant contactless power coupler including a first connector and a second connector, each of the first connector and the second connector having two poles and an insulator,
 wherein the first connector and the second connector are galvanically isolated from one another by the insulators.

2. The connecting lead of claim 1, wherein a resonant frequency of the resonant contactless power coupler differs from a Larmor frequency of the magnetic resonance tomograph.

3. The connecting lead of claim 1, further comprising one or more additional resonant power couplers.

4. The connecting lead of claim 1, wherein the poles of the first connector are connected to one another by a first conductor loop, and the poles of the second connector are connected to one another by a second conductor loop,
 wherein the first conductor loop is isolated from the second conductor loop by the insulator, and
 wherein a projection of a first area enclosed by the first conductor loop onto a second area enclosed by the second conductor loop substantially encompasses the second area.

5. The connecting lead of claim 4, wherein the first conductor loop is electrically, magnetically, or electrically and magnetically coupled to a resonance-generating element.

6. The connecting lead of claim 5, wherein the resonance-generating element includes a first inductor and a first capacitor.

7. The connecting lead of claim 1, further comprising a mechanical plug-in element having a first conductor loop,
 wherein the mechanical plug-in element is configured to provide, with a corresponding coupling element having a second conductor loop, a mechanical connection to a resonant contactless power coupler.

8. The connecting lead of claim 1, wherein the connecting lead includes a twisted core pair.

9. A receiving antenna of a magnetic resonance tomograph, the receiving antenna comprising:
 a connecting lead comprising a resonant contactless power coupler including a first connector and a second connector, each of the first connector and the second connector having two poles and an insulator, wherein the first connector and the second connector are galvanically isolated from one another by the insulators;
 an active amplifier element; and
 an energy supply configured to supply the active amplifier element with energy from a radio-frequency signal transmitted via the connecting lead that has a resonant frequency of the resonant contactless power coupler.

10. The receiving antenna of claim 9, further comprising a signal converter configured to convert a received magnetic resonance signal into a frequency range that is located in a resonant range of the resonant contactless power coupler.

11. The receiving antenna of claim 9, further comprising a demodulator configured to decode a modulated item of information in the radio-frequency signal.

12. A system comprising:
a patient couch;
a magnetic resonance tomograph; and
a receiving antenna comprising:
- a connecting lead arranged in the patient couch, the connecting lead comprising a resonant contactless power coupler;
- an active amplifier element; and
- an energy supply configured to supply the active amplifier element with energy from a radio-frequency signal transmitted via the connecting lead that has a resonant frequency of the resonant contactless power coupler, wherein the receiving antenna is magnetically resonantly coupled by the connecting lead to the magnetic resonance tomograph, wherein the magnetic resonance tomograph comprises an alternating current generator that is connectable to the connecting lead and is configured to supply the active amplifier element of the receiving antenna with energy and to generate an alternating current having a frequency that is substantially identical to a resonant frequency of the resonant contactless power coupler, and wherein the connecting lead is a first connecting lead, the patient couch comprises a second connecting lead and a retraction device, and the retraction device is configured to arrange the second connecting lead extendably in the patient couch.

13. The system of claim 12, wherein the receiving antenna further comprises a demodulator configured to decode a modulated item of information in the radio-frequency signal, and
- wherein the alternating current generator comprises a modulator configured to modulate an item of information onto the alternating current.

14. The system of claim 12, wherein the receiving antenna further comprises a signal converter, and
- wherein the magnetic resonance tomograph comprises a receiver configured to receive and evaluate a magnetic resonance signal converted by the signal converter into a resonant range of the resonant contactless power coupler.

* * * * *